United States Patent [19]

Esseluhn

[11] 4,235,191

[45] Nov. 25, 1980

[54] APPARATUS FOR DEPOSITING MATERIALS ON STACKED SEMICONDUCTOR WAFERS

[75] Inventor: Werner F. Esseluhn, Wyomissing, Pa.

[73] Assignee: Western Electric Company, Inc., New York, N.Y.

[21] Appl. No.: 16,685

[22] Filed: Mar. 2, 1979

Related U.S. Application Data

[62] Division of Ser. No. 891,867, Mar. 30, 1978, Pat. No. 4,160,682.

[51] Int. Cl.³ .......................................... H01L 21/208
[52] U.S. Cl. ...................................... 118/415; 118/421; 118/429; 156/621; 156/622; 148/171
[58] Field of Search ................. 156/621, 622; 118/401, 118/415, 421, 429; 148/171

[56] References Cited

U.S. PATENT DOCUMENTS

| | | | |
|---|---|---|---|
| 3,196,830 | 7/1965 | Lehovec | 118/401 |
| 3,665,888 | 5/1972 | Bergh et al. | 118/415 |
| 3,690,964 | 9/1972 | Saul | |
| 3,809,010 | 5/1974 | Springthorpe | |
| 3,853,643 | 12/1974 | Verleur | |
| 3,854,447 | 12/1974 | Kobayashi | |
| 3,880,680 | 4/1975 | Weyrich et al. | |
| 3,896,765 | 7/1975 | Ariga | |
| 3,933,123 | 1/1976 | Andre | |
| 4,129,093 | 12/1978 | Johnson | 118/401 |
| 4,160,682 | 7/1979 | Esseluhn | 118/415 |

OTHER PUBLICATIONS

Horikoshi, "A New Liquid Phase Epitaxial Growth Method for the Growth of (AlGa) As, GaAs Multilayers" Japanese Journal of Applied Physics, vol. 15 (1976), No. 5, pp. 887–888.

Yamaguchi et al., "Rotating Boat System—Diodes", Jap. Journal of Applied Physics, vol. 15, (1976), No. 7, pp. 1219–1227.

Saul et al., "Liquid Phase Epitaxy Processes for GaP LED's" Journal of Crystal Growth, 27, (1974), pp. 183–192.

Primary Examiner—John D. Smith
Attorney, Agent, or Firm—Donald C. Watson

[57] ABSTRACT

In certain manufacturing operations materials are deposited onto semiconductor wafers. For example, in liquid-phase epitaxial melt deposition, wafers are exposed to a melt having constituents identical to the wafer material. In the past this has been accomplished by individually sliding the wafers into the melt and/or sliding portions of melt onto the wafers. This sliding creates a high amount of friction which in turns generates particles which can contaminate the melt. Also, this friction limits the number of wafers that can be simultaneously processed by sliding techniques. To avoid this a movable melt reservoir 62 is located above stacked stationary wafers 44. Prior to deposition, the melt 68 in the reservoir is separated from the wafers 44 by offsetting an aperture 64 in the bottom of the reservoir 62 from a passageway 58 leading to the wafers 44. The reservoir 62 is then moved to align the aperture 64 either partially or completely with the passageway 58 to give a controlled flow of the melt 48 to the wafers 44. Since the reservoir 62 only moves a short distance, the friction and particles are minimal. Also, by providing slots 74 in the top of the wafer pocket 57, a gas-phase doping can be combined with the liquid deposition.

10 Claims, 5 Drawing Figures

APPARATUS FOR DEPOSITING MATERIALS ON STACKED SEMICONDUCTOR WAFERS

This is a division of application Ser. No. 891,867 filed Mar. 30, 1978 now U. S. Pat. No. 4,160,682.

FIELD OF THE INVENTION

This invention relates to depositing materials on stacked semiconductor wafer, and, more particularly, to depositing liquids on such wafers in communication with a common passageway.

DESCRIPTION OF THE PRIOR ART

In manufacturing certain types of semiconductor devices, the process of liquid-phase epitaxial growth has been used for some time. This is a process by which semiconductor wafers are exposed to a hot liquid melt which has constituents which include the same materials as the semiconductor wafer is made up of. The liquid phase epitaxy causes the growth of a new semiconductor layer on the surface of the wafer. The new layer is of the same type of material as the wafer. But it contains doping agents which were present in the melt.

Light-emitting diodes frequently are manufactured using liquid-phase epitaxial growth processes. Typically, a wafer of semiconductor material such as gallium phosphide is exposed to a hot melt made up of materials such as gallium, gallium phosphide and other constituents such as zinc or tellurium.

One prior liquid-phase epitaxial melt deposition process (sometimes called the "slider" technique) has been to place the melt in an elongated reservoir with wafers mounted in slidable wafer pockets adjacent to the reservoir. When the melt reaches the proper temperature, a portion of the wafers are slid into the reservoir. At the same time sections of the reservoir are slid over the remaining wafers.

Unfortunately, the slider technique takes up a good deal of space and requires a relatively cumbersome apparatus to facilitate all the sliding which must occur. Furthermore, the large amount of friction created by the sliding generates particles which lead to frequent jamming and improper exposure. Also, the melt itself is often contaminated by the particles.

SUMMARY OF THE INVENTION

It is, therefore, an object of the present invention to provide methods of and apparatus for depositing liquid onto a plurality of semiconductor wafers.

Another object of the present invention is to provide methods of and apparatus for controlling the flow of a liquid deposited onto a plurality of semiconductor wafers.

A further object of the present invention is to provide methods of and apparatus for depositing liquid-phase epitaxial material onto a plurality of semiconductor wafers with a minimum amount of sliding and particle contamination of the epitaxial material.

With these and other objects in view, the present invention provides methods of depositing liquid onto a plurality of semiconductor wafers with a minimum amount of sliding and particle contamination of the epitaxial material.

With these and other objects in view, the present invention provides methods of depositing liquid onto a plurality of semiconductor wafers which are held adjacent to a passageway. A reservoir is filled with the liquid while an aperture in the bottom of the reservoir is out of alignment with the passageway leading to the wafers. By producing relative movement between the reservoir and the passageway to align the aperture with the passageway, the liquid flows through the passageway onto the wafers.

Furthermore, the present invention provides an apparatus for depositing liquid onto a plurality of semiconductor wafers which are held adjacent to a passageway. A reservoir filled with the liquid is coupled to the passageway. To allow liquid to flow from the reservoir to the wafers, an aperture is provided in the reservoir. This aperture is blocked when it is out of alignment with the passageway to prevent the flow of liquid from the reservoir. When relative movement is provided between the reservoir aperture and the passageway to align them, the liquid flows through the passageway and onto the wafers.

BRIEF DESCRIPTION OF THE DRAWING

These and other objects of the present invention will become better understood by reference to the drawing wherein.

DETAILED DESCRIPTION OF THE INVENTION

Prior Art Slider Techniques

Figure 1:
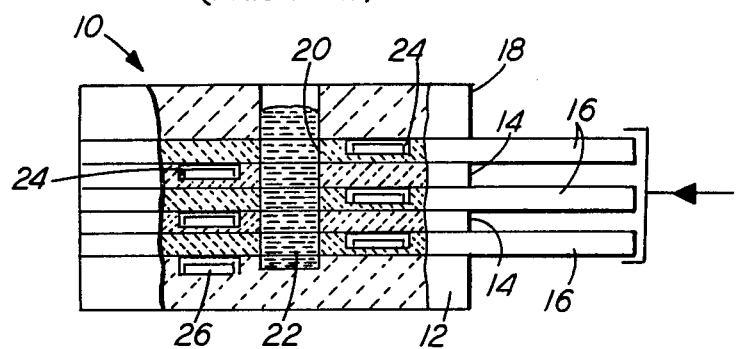
FIG. 1 is a cross-sectional view of a prior art slider apparatus prior to deposition of the liquid-phase epitaxial material.

Referring now to the drawing and in particular to FIG. 1, a typical prior art slider apparatus 10 for liquid-phase epitaxial deposition is shown. The slider apparatus 10 has a stationary base plate 12, stationary intermediate plates 14, movable intermediate plates 16 and a stationary top plate 18. Apertures in each of the plates 12, 14, 16 and 18 are aligned to form a reservoir 20 for holding a melt material 22. Wafer pockets 24 are formed by depressions in the plates 12, 14 and 16 for holding wafers 26.

In FIG. 1 the slider apparatus 10 is shown before exposure of the wafers 26 to the melt 22. Thus, the wafer pockets 24 in the movable intermediate plates 16 are on the right side of the reservoir 20 while the wafer pockets 24 in the stationary plates 12 and 14 are on the left side of the reservoir 20.

Figure 2:
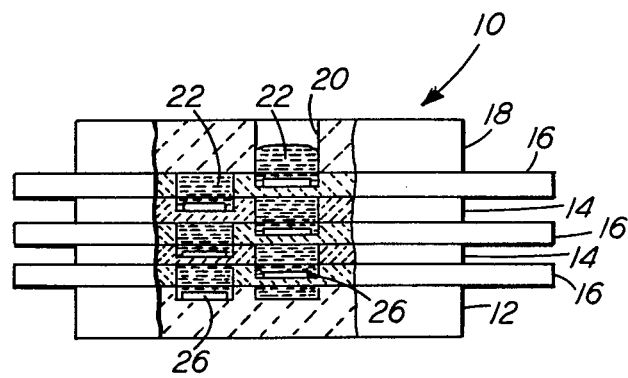
FIG. 2 is a cross-sectional view of a prior art slider apparatus after deposition of the liquid-phase epitaxial material.

Referring now to FIG. 2, the slider apparatus 10 is shown after the movable intermediate plates 16 have been slid to expose the wafers 26 to the melt 22. As shown, the wafers 26 on the movable intermediate plates 16 are slid under sections of the melt 22 which were formed by the apparatus in the stationary plates 12, 14 and 18. At the same time, the sections of the melt 22 which were formed by the apertures in the movable intermediate plates 16 are slid over the wafers 26 held in the wafer pockets 24 in the stationary plates 12 and 14.

As discussed previously, the prior art slider apparatus 10 requires a large amount of movement. The friction that this sliding generates can cause jamming and create contaminating particles.

Deposition of Liquid-Phase Epitaxial Material Onto Semiconductor Wafers

Figure 3:
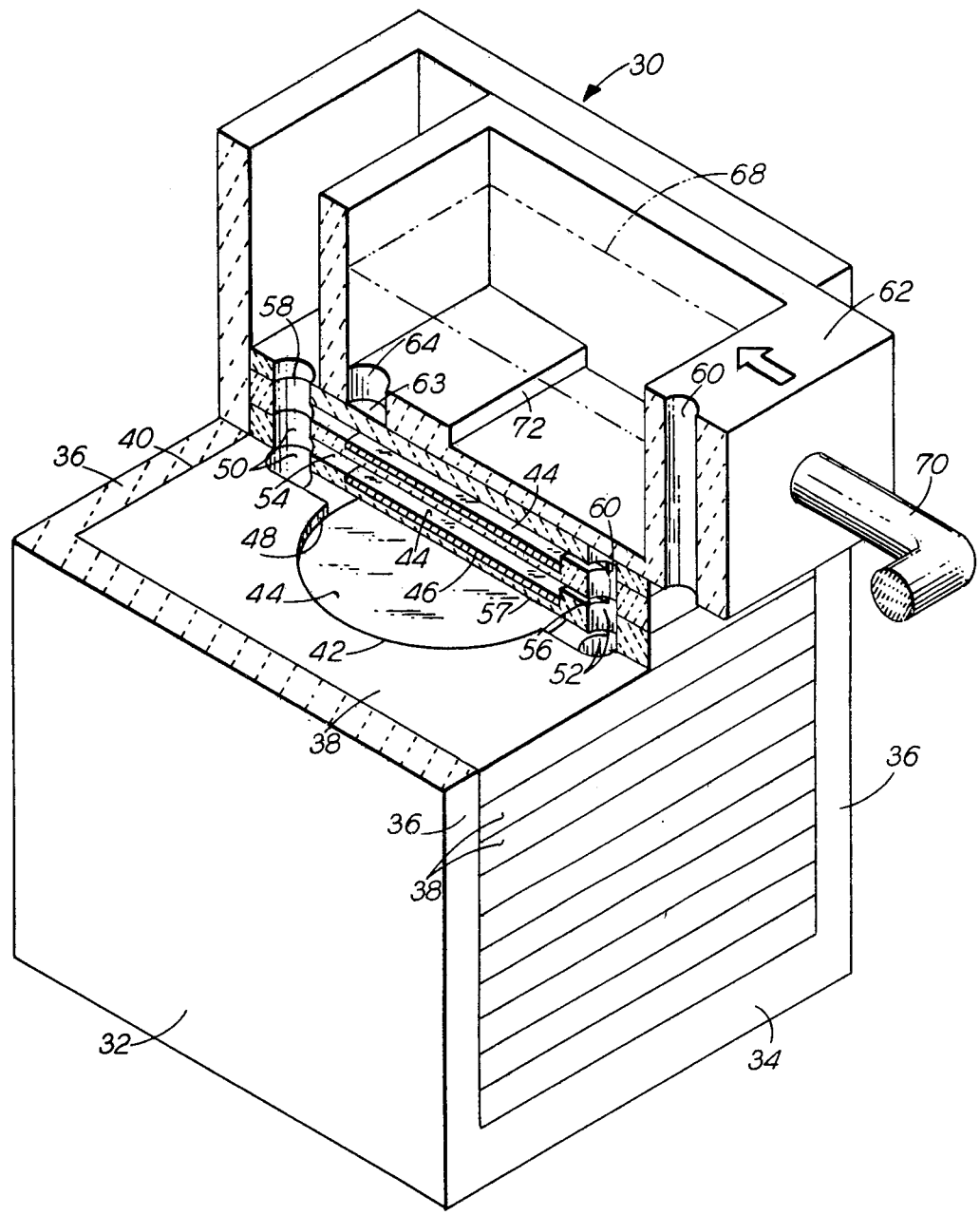
FIG. 3 is a perspective view partially cutaway of a first embodiment of the present invention prior to deposition of the liquid-phase epitaxial material.

Referring now to FIG. 3, the deposition apparatus, designated generally as 30, is shown prior to the deposition. The outer casing 32 of the deposition apparatus 30 comprises a bottom 34 and three upright walls 36. The top and one side of the outer casing are left open.

A plurality of plates 38 are inserted into the open side of the outer casing 32. The lowermost of these plates 38 rests upon the bottom 34 of the outer casing 32, and the remaining plates are stacked vertically upon it. The plates 38 are all pushed into the outer casing 32 such that their edges 40 abut the upright wall 36 opposite the open side.

Each of the plates 38 has a wafer pocket 42 formed by a depression in the plate 38 for holding a semiconductor wafer 44. A single wafer 44 is placed onto the bottom surface 46 of each of the wafer pockets 42 with the side requiring the subsequent liquid contact facing upward. Sidewalls 48 of the wafer pockets 42 prevent excessive lateral movement of the wafer 44. Each of the plates 38 also has a first opening 50 on one side of the wafer pocket 42 and a second opening 52 on the opposite side of the wafer pockets.

With the plates stacked upon one another, input and output gates 54 and 56 for the wafer pockets 42 are formed above the sidewalls 48. Also, the undersides of the stacked plates 38 form top surfaces for the wafer pockets 42 immediately below them.

Also by virtue of stacking the plates 38, the first openings 50 combine to form an input passageway 58 while the second openings 52 combine to form a vent passageway 60. The input passageway 58 is coupled to the wafer pockets 42 by the input gates 54. In a similar manner, the vent passageway 60 is coupled to the wafer pockets 42 by the output gates 56. Generally, the vent passageway 60 and the output gates 56 are much thinner than the input passageway 58 and the input gates, respectively, since they are only intended to pass gas.

To provide for deposition, a melt reservoir 62 is placed onto a cover plate 63 which is placed on the uppermost of the plates 38. The top surface of the cover plate 63 is flat. An aperture 64 is is provided in the bottom of the reservoir 62. As shown in FIG. 3, the reservoir is moved into such a position that the aperture 64 is out of alignment with the input passageway 58. In this out of alignment position, the aperture 64 is blocked by the top surface of the cover plate 63. The reservoir 62 is filled with the constituents for the melt 68 which typically are in a solid state. Typically, for the growth of red light-emitting diodes, melt constituents would include gallium, gallium phosphide with dopants such as tellurium zinc, or gallium oxide. Since the aperture 64 is out of alignment with the input passageway 58 when the melt 68 is placed into the reservoir 62, the melt 68 will not be able to flow out of the reservoir.

Once the reservoir 62 has been filled with the constituents for the melt 68, the entire deposition apparatus 30 is placed into a furnace (not shown) to melt the various constituents to actually form the melt 68. By way of example, for N-type epitaxial deposition a melt made up of gallium, gallium phosphide, and tellurium is heated in a furnace at $1040° \pm 1°$ C. for 45 to 60 minutes. For P-type epitaxial deposition, a melt 68 made up of gallium, gallium phosphide, zinc and gallium oxide may be heated at a temperature of $1060° \pm 1°$ C. for 45 to 60 minutes. Generally, the furnace ambient is nitrogen.

Figure 4:
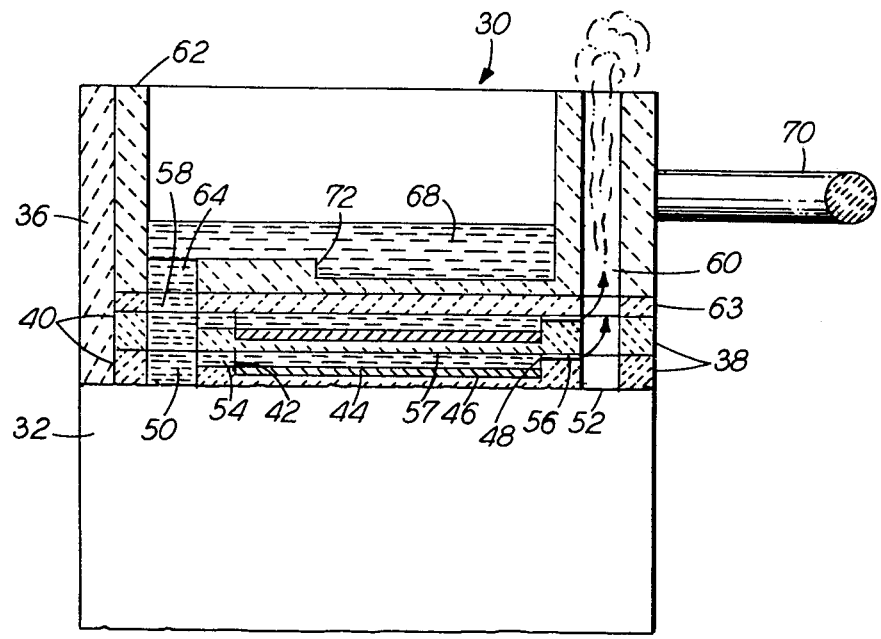
FIG. 4 is a cross-sectional view of the first embodiment of the present invention after deposition of the liquid-phase epitaxial material.

Referring now to FIG. 4, the deposition apparatus 30 is shown during the actual deposition of the melt 68 onto the semiconductor wafers 44. The reservoir 62 has been slid by a pushrod 70 the short distance required to align the aperture 64 with the passageway 58. Once the aperture 64 is aligned with the input passageway 58, the melt 68 can flow through the input passageway and input gates 54 onto the wafers 44. Gas which was present in the wafer pockets 42 prior to the deposition is exhausted through the output gates 56 into the vent passageway 60.

The reservoir 62 is designed to have sufficient weight to hold all of the plates 38 together even after the melt material has been emptied from it. This is necessary since the melt 68 exerts a lifting force on the plates 38 as a result of the vertical liquid pressure. This liquid force tends to separate the plates 38. Alternatively, the plates 38 could be clamped together if it were desired to use a lighter reservoir 62.

An important aspect of the present invention is the minimal movement required to cause the flow of the melt 68 onto the wafers 44. Since the only movement of elements is the short sliding of the reservoir 62 to align the aperture 64 with the input passageway 58, a minimum amount of friction is generated. This greatly reduces the generation of any particles by the sliding which could contaminate the melt 68.

It should be noted that the invention as shown in FIGS. 3 and 4 allows for a controlled flow of the melt 68 from the reservoir 62. This control is gained simply by setting the amount of alignment between the aperture 64 and the input passageway 58 to give the flow rate desired. Such control of the flow rate can allow for establishing the proper turbulence to eliminate any stratification which may tend to occur with a particular melt 68. Also the size of the aperture 64 or of the opening 50 in the top plate 63 may be used to provide control of the flow.

To prevent unliquified particles of the melt material 68 from being deposited onto the wafers 44, a ridge 72 is located on the bottom of the reservoir 62 immediately adjacent the aperture 64. This ridge 72 extends completely along the aperture 64 so that any melt 68 below the level of the ridge 72 will not enter into the aperture 64. Since any unliquified particles present in the melt 68 will frequently sink to the bottom of the melt, the ridge 72 prevents the entry of such particles into the passageway 58.

The deposition of the melt 68 is done with the deposition apparatus 30 still in the furnace, generally at the same temperature at which the material in the melt 68 was melted. After the deposition, a typical time for epitaxial growth of an N-type material for a red-type light-emitting diode is eight hours. A typically epitaxial growth time for a P-type epitaxial material is about 20 hours.

If the deposition apparatus 30 is to be used for liquid-phase epitaxial deposition, the materials chosen for manufacturing should be capable of withstanding the high temperatures. Also the plates 38 and the reservoir 62 should be made of an extremely pure material which will not contaminate the melt 68 or the wafers 44.

Quartz and boron nitride are examples of materials having these qualities. The outer case 32, of course, can also be made from these materials. But graphite or a similar material could also be used since it does not contact the melt 68 or the wafers 44. It should, of course, be noted that in operations which do not require such high temperature and purity any type of material suitable for the particular operation could be used.

Combination of Gas-Phase Doping With The Liquid-Phase Epitaxial Deposition Apparatus In FIGS. 3 and 4 the output gates 56 and the vent passageway 60 were shown and described in terms of their use for venting gas from the wafer pockets 42 during the deposition of the melt 68. Beyond this, these passageways can also be used to combine the liquid-phase epitaxy with a gas-phase doping of the melt. For example, after the deposition of the melt 68, gas can be introduced into the wafer pockets 42 through the vent passageway 60 and the output gates 56. Alternatively, gas can be introduced into the wafer pockets 42 prior to the liquid-phase deposition.

Figure 5:
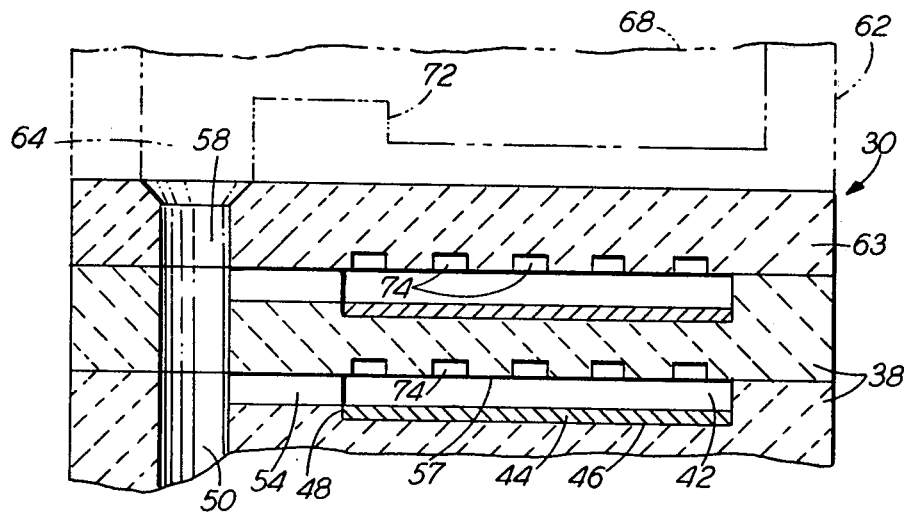
FIG. 5 is a cross-sectional view showing an alternative embodiment of the present invention for providing gaseous communication from the wafers to the outside of the apparatus.

FIG. 5 shows an alternative way of introducing or venting gas at the wafer pockets 42. Specifically, the top surfaces 57 of the wafer pockets 42 are provided with a plurality of grooves 74 for the gas to flow through. These grooves 74 are coupled directly out the sides of the plates 38. The sides of the outer casing 32 are provided with large openings (not shown) which provide gaseous access to the grooves 74 from the surrounding ambient. A significant advantage of the grooves 74 is the even distribution of the gas which they allow.

An example of using the apparatus for combined liquid deposition and gas phase doping is a process for making green light-emitting diodes. Under this process a gallium phosphide wafer has a liquid melt of gallium and gallium phosphide deposited upon it in the manner previously described. The furnace ambient is hydrogen. Dopant is then introduced into the wafer pockets 42 as a gas either through the vent passageway 60 or the grooves 74. For N-type doping the gas can contain sulfur or tellurium. For P-type doping zinc can be used in the gas.

In a liquid-phase epitaxial deposition such as described herein using a doped gallium phosphide melt and a 0.012 inch thick wafer, a typical diameter for the input passageway 58 and the aperture 64 is 0.25 inch. This allows for a free flow of the gallium. To continue this free flow onto the wafers 44, the input gates 54 are typically 0.040 inch or larger.

The vent passageway 60, on the other hand, can be much narrower than the input passageway 58 since its purpose is to allow for gas flow rather than liquid flow. In fact, it has been found useful to keep the size of the output gate 56 and the vent passageway 60 at 0.010 inch since this is narrow enough for surface tension to prevent any flow of the gallium through the gate 56. This reduces the amount of gallium necessary for the deposition since none will be wasted in filling the vent passageway 60. Similarly, the grooves 74 can be made 0.010 inch wide to prevent any flow of gallium into them. This allows gaseous communication even after the liquid deposition. It is, of course, to be understood that these dimensions could be varied considerably depending on the material being deposited and the flow rates desired.

Although the invention has been described in terms of liquid-phase melt material deposition onto a semiconductor wafer, it should be understood that the invention is not so limited. The method and the apparatus described could be used for the deposition of any type liquid onto a semiconductor wafer of any type. Examples of this could be coating, etching, cleaning or treating solutions. Furthermore, it should be noted that the invention is in no way limited to gallium phosphide wafers since it could be practiced equally well with other types of semiconductor wafers such as silicon or germanium.

It should further be noted that although the invention has been described in terms of a vertical input passageway 58 allowing for a gravity feed of the liquid, the invention could be used with the passageway 58 at other angles. This could include even a horizontal passageway if a pressure were exerted to force the liquid through the passageway 58 to the wafer pockets 42. Similarly, the wafer pockets 42 themselves could be arranged at angles other than the horizontal angle shown.

Furthermore, although the invention has been described in terms of a single reservoir 62 and a single stack of plates 38, it is to be understood that the invention may readily be used with a plurality of stacks of plates 38. Alternatively, a single large reservoir 62 could be provided with a plurality of apertures 64 each of which is aligned with a stack of plates 38.

Industrial Applicability

The methods and apparatus described herein have a wide range of industrial applicability in regard to any process involving the deposition of a liquid onto a semiconductor wafer. This could include, but is not limited to, the deposition of liquid-phase epitaxial material, cleaning solutions, or etching solutions.

In regard to the deposition of liquid-phase epitaxial material, the process is particularly adaptable to the manufacture of light-emitting diodes. Liquid-phase epitaxial growth is frequently used in the manufacture of light-emitting diodes to grow the N and P layers onto semiconductor wafers such as gallium phosphide. Such light-emitting diodes have found particular use in lamps such as those used for switchboards and as light sources for opto-isolator circuits and devices.

It is to be understood that the above-described arrangements are simply illustrative of the application of the principles of this invention. Numerous other arrangements may be readily devised by those skilled in the art which embody the principles of the invention and fall within its scope and spirit.

What is claimed is:

1. An apparatus for depositing material onto a plurality of semiconductor wafers comprising:
    means for holding the wafer in a stacked relationship in communication with a common passageway; and
    a reservoir for holding the material, said reservoir having an aperture therein and being moveable into and out of alignment of the aperture with the passageway sufficiently to permit selective flow of the material through the passageway and onto the stacked wafers.

2. An apparatus for depositing materials onto a plurality of semiconductor wafers, comprising:
    a plurality of plates, each having first and second major surfaces and a first opening through such plate, the plates being positioned with their major surfaces adjacent to one another, the first surface of each plate being in contact with the second surface of each adjacent plate and the first openings in each of the plates being aligned with one another to form a first common passageway;

a pocket located in the first surface of each plate for holding a wafer therein, the pocket being covered by the second surface of the adjacent plate;

an input gate located in the first surface of each plate, the gate being covered by the second surface of the adjacent plate, the gate extending from the water pocket to the first common passageway;

a reservoir positioned adjacent to the plates for holding the materials, such reservoir having an aperture, the aperture being out of alignment with the first common passageway to initially prevent communication from the reservoir to the first passageway; and means to move the reservoir to align the aperture in the reservoir with the first common passageway to permit the material to flow through the common passageway and onto the wafers.

3. The apparatus of claim 2, wherein each of the said plates has a second opening through such plate, such second openings in the said plates being aligned to form a second common passageway; and an output gate located in the first surface of each plate and covered by the second surface of the adjacent plate, the output gate extending from the wafer pocket to the second common passageway, each such output gate having an opening of a size to provide gaseous communication between each wafer pocket and the common passageway while blocking the flow of the material therethrough by surface tension of the material across the gates.

4. The apparatus of claim 2, further comprising:

a plurality of grooves formed in the second surface of each plate opposite the wafer pocket in the first surface of each adjacent plate, the grooves being uniformly disposed opposite the wafer pocket and extending to the outside, such grooves being sufficiently large to provide gaseous communication between each wafer pocket and the outside and the grooves being sufficiently narrow to cause surface tension across the grooves to block the flow of material therethrough.

5. An apparatus for depositing liquid-phase epitaxial material onto a plurality of semiconductor wafers comprising:

a plurality of wafer pockets located along a common vertical passageway, the pockets holding the wafers in communication with the passageway;

a reservoir for holding the material, said reservoir having a bottom plate with an aperture therein and being moveable with respect to an upper end of the passageway to permit moving said aperture into and out of alignment with said end of the passageway; and means for blocking the aperture when the aperture is out of alignment with the upper end of the passageway and for unblocking said aperture in response to a movement of said reservoir into at least partial alignment with said upper end of the common passageway, whereby said material is permitted to flow under the force of gravity through said aperture into said common passageway and onto the wafers held in the wafer pockets.

6. The apparatus of claim 5, further comprising:

at least one opening in each of the wafer pockets leading to the exterior of the apparatus to provide gaseous communication into and out of the wafer pockets.

7. The apparatus of claim 5, wherein each of the wafer pockets has a substantially horizontal bottom surface for holding a wafer and a substantially horizontal top surface spaced from the bottom surface, the top surface having at least one groove therein leading to the outside of the apparatus to allow for gaseous communication into and out of the wafer pockets.

8. The apparatus of claim 5, further comprising:

a raised ridge along the bottom reservoir plate adjacent the aperture to prevent material in the reservoir below the level of said raised ridge from entering into the aperture and the passageway.

9. The apparatus of claim 5, wherein the means for blocking the aperture includes a cover plate located under the reservoir and above the wafer pockets, the plate having a top surface in contact with the aperture in the bottom of the reservoir to block said aperture and the plate having an opening therethrough in communication with the passageway to unblock said aperture in response to said movement to align said aperture with said upper end of the common passageway.

10. The apparatus of claim 5, wherein the plurality of wafer pockets are also located along another common passageway, said passageway being in communication with each of the wafer pockets to release gas from the pockets when the material is deposited onto the wafers.

* * * * *